US008018003B2

(12) United States Patent
Patil (10) Patent No.: US 8,018,003 B2
(45) Date of Patent: Sep. 13, 2011

(54) LEAKAGE POWER REDUCTION IN CMOS CIRCUITS (75) Inventor: Chandrashekhar V. Patil, Hyderabad (IN)

(73) Assignee: Synopsys, Inc., Mountain View, CA (US)

( * ) Notice: Subject to any disclaimer, the term of this patent is extended or adjusted under 35 U.S.C. 154(b) by 765 days.

(21) Appl. No.: 11/139,255

(22) Filed: May 27, 2005

(65) Prior Publication Data
US 2006/0267108 A1 Nov. 30, 2006

(51) Int. Cl.
H01L 29/76 (2006.01)

(52) U.S. Cl. ............... 257/368; 257/401; 257/E21.632; 438/301

(58) Field of Classification Search .................. 257/368, 257/401, E21.632; 438/301
See application file for complete search history.

(56) References Cited

U.S. PATENT DOCUMENTS
6,071,783 A * 6/2000 Liang et al. ............ 438/301
6,541,343 B1 * 4/2003 Murthy et al. ........... 438/299

OTHER PUBLICATIONS

Chen et al.: "Back-Gate Bias Enhanced Band-To-Band Tunneling Leakage in Scaled MOSFET's", IEEE Electron Device Letters, vol. 19, No. 4., Apr. 1998, pp. 134-136.
Ko et al.: "Short-Circuit Power Driven Gate Sizing Technique for Reducing Power Dissipation", IEEE Transactions on Very large Scale Integration (VLSI) Systems, vol. 3, No. 3, Sep. 1995, pp. 450-455.
Adan et al.: "SOI As a Mainstream IC Technology", Proceedings 1998 IEEE International SOI Conference, Oct. 1998, pp. 9-12.
Roy et al.: "Leakage Current Mechanisms and Leakage Reduction Techniques in Deep-Submicrometer CMOS Circuits", Proceedings of the IEEE, vol. 91, No. 2, Feb. 2003, pp. 305-327.
Mukhopadhyay et al.: "Accurate Estimation of Total Leakage Current in Scaled CMOS Logic Circuits Based on Compact Current Modeling", Dept. Of Electrical & Computer Engineering, Purdue University, West Lafayette, IN-47907-1285, USA, Jun. 2-6 2003, pp. 169-174.
Long et al.: "Distributed Sleep Transistor Network for Power Reduction", DAC2003, Jun. 2-6, Anaheim, CA USA, pp. 181-186.
Tsai et al.: "Implications of Technology Scaling on Leakage Reduction Techniques", DAC2003, Jun. 2-6, Anaheim CA, USA, pp. 187-190.
Rao et al.: "Efficient Techniques for Gate Leakage Estimation", ISLPED'03, Aug. 25-27, 2003, Seoul, Korea, pp. 100-103.
Abdollahi et al.: "Leakage Current Reduction in CMOS VLSI Circuits by Input Vector Control", IEEE Transactions on Very Large Scale Integration (VLSI) Systems, vol. 12, No. 2, Feb. 2004, pp. 140-154.
Fukuoka et al.: "Leakage Power Reduction for Clock Gating Shceme on PD-SOI", 2004 IEEE, ISCAS 2004, pp. II-613 to II-616.
Sung-Mo Kang et al., "CMOS Digital Integrated Circuits: Analysis and Design," 2nd ed. McGraw-Hill, 1999.
Sung-Mo Kang et al., "CMOS Digital. Integrated Circuits: Analysis and Design," 2nd ed. McGraw-Hill, 1999; pp. 87-112.

* cited by examiner

Primary Examiner — Samuel A Gebremariam
(74) Attorney, Agent, or Firm — Bever, Hoffman & Harms, LLP; Jeanette S. Harms (57) ABSTRACT A field effect transistor includes a source region and a drain region in contact with a channel region. The source and drain regions are formed in insulating pockets that cause the source and drain regions to be electrically isolated from the substrate, thereby minimizing junction capacitance and device crosstalk. The structures that define the insulating pockets can be insulating layers formed in one or more wells in the substrate, or can be a blanket insulating formed over the substrate in which a well is formed to contain the transistor.

19 Claims, 6 Drawing Sheets

LEAKAGE POWER REDUCTION IN CMOS CIRCUITS

BACKGROUND OF THE INVENTION

1. Field of the Invention

The invention relates to the field of semiconductors, and in particular, to an efficient, high-performance field effect transistor.

2. Related Art

Modern semiconductor devices are continually being reduced in size to improve integrated circuit (IC) capabilities and performance. Smaller devices enable greater device density in an IC, thereby enabling the implementation of increased functionality in a reduced area. Unfortunately, this continued scaling of device geometries can also result in undesirable device characteristics.

For example, as a metal-oxide-semiconductor (MOS) transistor is scaled, the supply voltages provided to that MOS transistor must be reduced to prevent physical damage to the device. Consequently, the gate oxides of such scaled transistors must be made thinner and thinner to so that proper transistor action is maintained. However, a thinner gate oxide can result in increased subthreshold and band-to-band tunneling (BTBT) leakage currents (e.g., leakage current between the drain and bulk (substrate)). These leakage currents can undesirably increase power consumption and can also negatively impact device reliability. In addition, such leakage currents can turn on parasitic transistors in complimentary metal-oxide-semiconductor (CMOS) ICs, thereby causing latchup and weakening or even destroying the affected devices.

Accordingly, it is desirable to provide a structure and method for creating a scalable MOS transistor that minimizes leakage currents.

SUMMARY OF THE INVENTION

Field effect transistors (FETs) such as MOS transistors can exhibit significant leakage currents that can undesirably increase power consumption and reduce device performance. By creating the source and drain regions for a MOS transistor within insulated pockets that electrically isolate those source and drain regions from the substrate, such leakage currents can be significantly reduced, thereby improving power efficiency and device/circuit reliability.

In one embodiment, a FET (e.g., in an IC) can include insulating layers formed in wells in a substrate that define the insulated pockets in which the source and drain regions are formed. The wells in the substrate are formed on each side of the channel region for the FET, and the insulating layers cover all the non-channel surfaces of the wells. The insulating pockets defined by the insulating layers can then be filled with semiconductor material to form the source and drain of the FET.

In another embodiment, a FET (e.g., in an IC) can include an insulating layer formed in a single well in the substrate. The insulating layer covers all the surfaces of the well and actually defines a single large insulating pocket, portions of which act as the insulating pockets for the source and drain regions of the FET. Once the insulating layer is created, the large insulating pocket can be filled with semiconductor material and appropriate doping can be applied to define the source, drain, and channel regions of the FET.

In another embodiment, a FET (e.g., in an IC) can be formed in a well created in a blanket insulating layer formed over the substrate. In various embodiments, the blanket insulating layer can cover the entire substrate, or can cover large portions of the substrate (i.e., portions large enough to encompass one or more transistors). Thus, the well in the blanket insulating layer actually defines the insulating pockets for the source and drain regions, while blanket insulating layer itself provides the electrical isolation of the FET from the substrate.

The invention will be more fully understood in view of the following description and drawings.

DETAILED DESCRIPTION

Field effect transistors (FETs) such as MOS transistors can exhibit significant leakage currents that can undesirably increase power consumption and reduce device performance. By creating the source and drain regions for a FET within insulated pockets that electrically isolate those source and drain regions from the substrate, such leakage currents can be significantly reduced, thereby improving power efficiency and device/circuit reliability.

Figure 1:
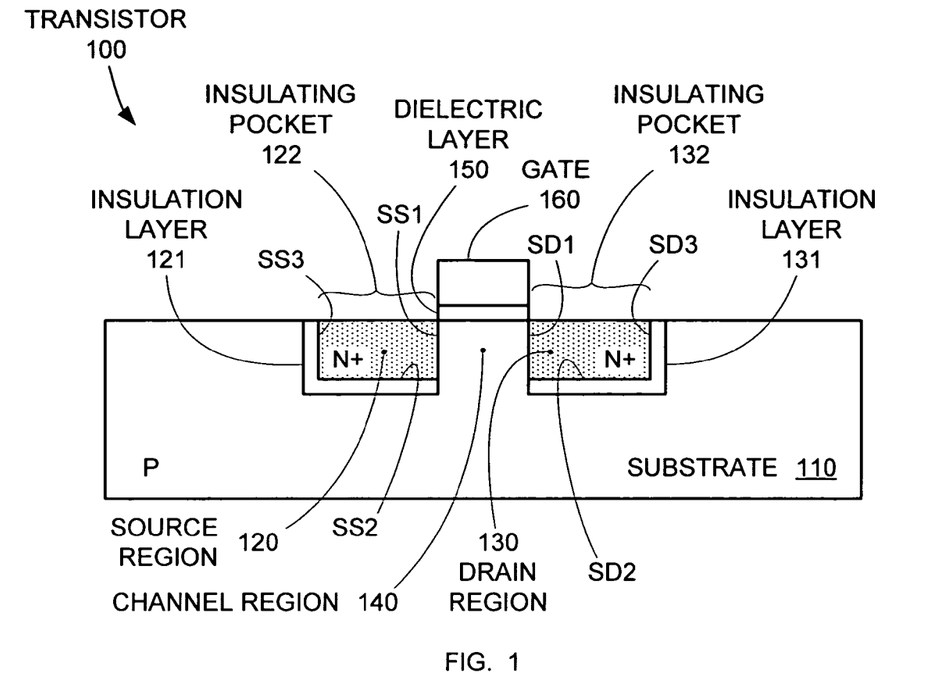
FIG. 1 shows a side view of a FET transistor that includes source/drain insulating pockets for reducing leakage current.

FIG. 1 shows an embodiment of a transistor 100 that includes structures for reducing leakage current. Transistor 100 includes a source region 120, a drain region 130, a gate dielectric 150 formed over a channel region 140 between source region 120 and drain region 130, and a gate 160 formed over gate dielectric 150. Note that the particular shapes and constructions of source region 120, drain region 130, channel region 140, gate dielectric 150, and gate 160 are exemplary, and various other embodiments can include other configurations and constructions of the listed elements. For example, gate dielectric 150 and/or gate 160 could be implemented as multi-layer structures. Likewise, source region 120 and/or drain region 130 could include lightly-doped or heavily-doped regions next to channel region 140, or other source and/or drain implementations.

Figure 2A:
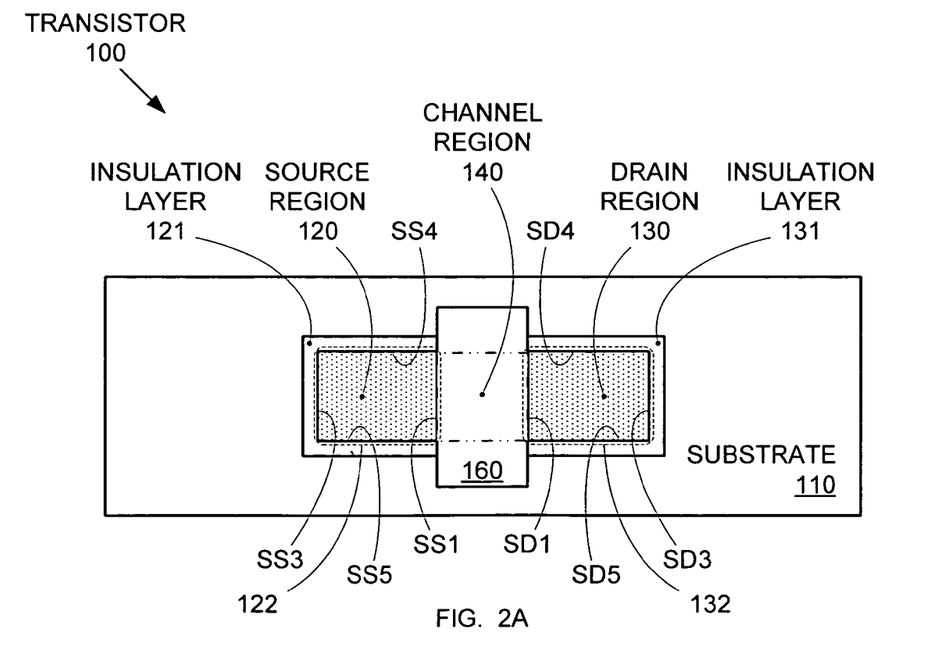
FIG. 2A shows a top view of the FET transistor of FIG. 1.

Source region 120 and drain region 130 are formed over insulation layers 121 and 131, respectively. Insulation layers 121 and 131 form insulating pockets 122 and 132, respectively, that electrically isolate source regions 140 and 150, respectively, from substrate 110 except in channel region 140. Insulation layers 121 and 131 can comprise any electrically-insulating material, such as silicon oxide, silicon nitride, aluminum oxide, tantalum pentoxide, lanthanum oxide, gadolinium oxide, yttrium oxide, hafnium oxide, zirconium oxide, strontium titanate, zirconium silicate, hafnium silicate, aluminum nitride, diamond, and sapphire, among others. FIG. 2 shows a top view of transistor 100 that depicts how insulating pockets 122 and 132 cover the non-channel surfaces of source region 120 and drain region 130, respectively. Specifically, all the embedded surfaces (i.e., surfaces formed within substrate 110) of source region 120 and drain region 130 are isolated from substrate 110 (except for those surfaces in contact with channel region 140). For example, source region 120 includes embedded surfaces SS1, SS2, SS3, SS4, and SS5 (surfaces SS1-SS3 are shown in FIG. 1, while surfaces SS4 and SS5 are shown in FIG. 2). Insulation layer 121 only covers surfaces SS2-SS5, and therefore does not affect the interface between source region 120 and channel region 140. At the same time, surfaces SS2-SS5 are electrically isolated from substrate 110, thereby eliminating (or substantially minimizing) leakage currents through those surfaces. In a similar manner, embedded surfaces SD2, SD3, SD4, and SD5 of drain region 130 are isolated from substrate 110 by insulation layer 131, and surface SD1 of drain region 130 is positioned directly adjacent to channel region 140.

Insulating layers 121 and 131 minimize leakage power consumption and improve switching speed for transistor 100 by significantly reducing the junction capacitances at source region 120 and drain region 130. For example, in a conventional MOS transistor, the total junction capacitance Ceq (STD) in the source or drain region is given by the following:

$$Ceq(STD)=Ac*Cjc*Keqc+Asw*Cjsw*Keqsw \quad [EQ. 1]$$

where Ac is the area of channel sidewall (i.e., the sidewall of the source/drain region adjacent to the channel region), Cjc is the zero bias junction capacitance of the channel sidewall, Keqc is the voltage equivalence factor of the channel sidewall, Asw is the area of the non-channel embedded surfaces of the source/drain region, Cjsw is the total capacitance of the non-channel embedded sidewalls, and Keqsw is the voltage equivalence factor of the non-channel embedded sidewalls. Clearly, the total junction capacitance Ceq in a conventional MOS transistor will be dominated by the relatively large non-channel surfaces.

However, when applying Equation 1 to drain region 130 of transistor 100, Ac corresponds to the area of surface SD1, while Asw corresponds to the total area of surfaces SD2-SD5. Likewise, Cjc corresponds to the zero bias junction capacitance of surface SD1, while Cjsw corresponds to the total junction capacitance of surfaces SD2-SD5. Due to insulation layer 131 in transistor 100, the capacitances at non-channel embedded surfaces SD2-SD5 are essentially eliminated (i.e., Cjsw is equal to zero), and Equation 1 can be reduced to the following:

$$Ceq(100)=Ac*Cjc*Keqc \quad [EQ. 2]$$

where Ceq(100) is the total junction capacitance of transistor 100. The second term of Equation 1 drops out of Equation 2 since capacitance Cjsw of the non-channel embedded surfaces SD2-SD5 is essentially eliminated by insulation layer 131. Thus, the total junction capacitance of transistor 100 is reduced to the (necessary) junction capacitance at channel region 140, meaning that the switching speed and power efficiency of transistor 100 can be significantly improved over conventional transistors.

Figure 2B:
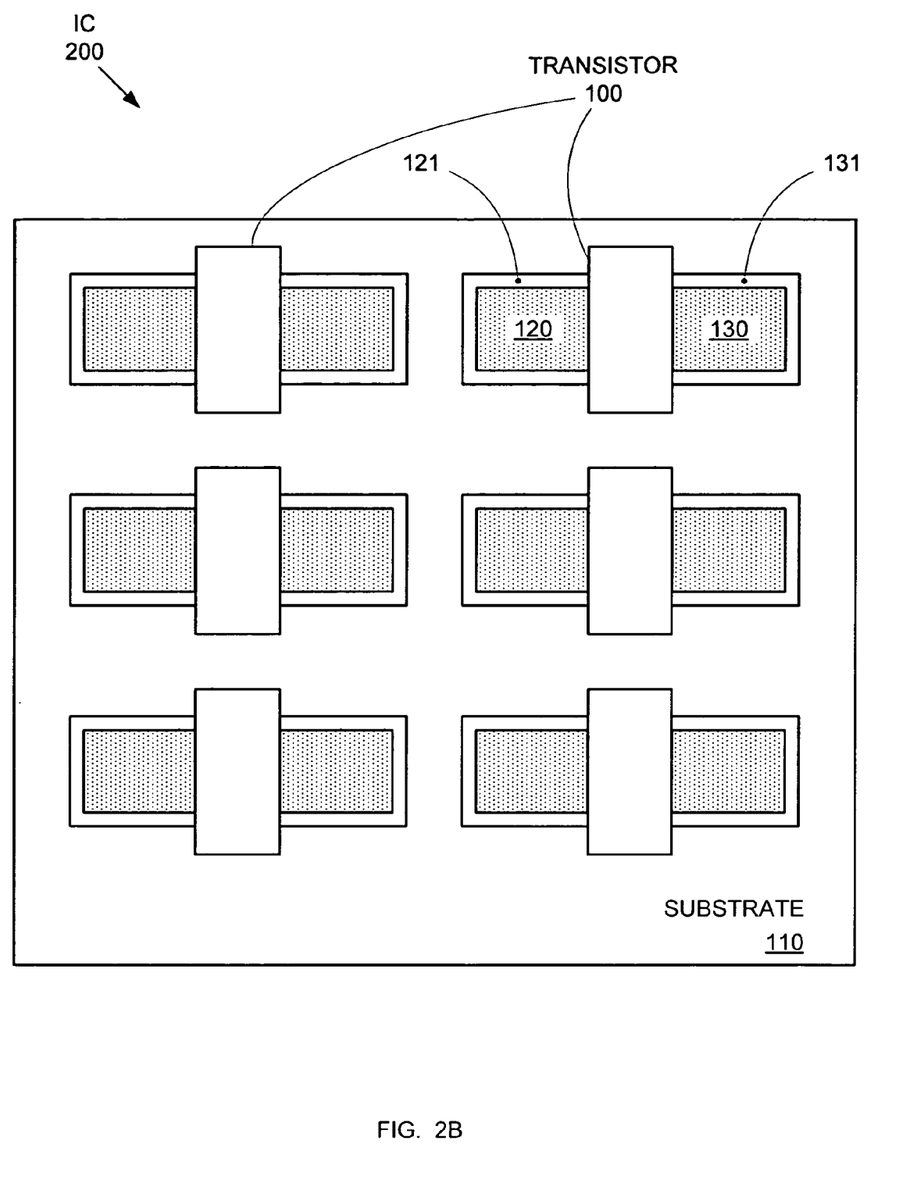
FIG. 2B shows an IC that includes an array of the FET transistors of FIG. 2A.

Note that insulating layers 121 and 131 can also prevent crosstalk between adjacent devices in an IC. For example, FIG. 2B shows an IC 200 that includes an array of transistors 100 (described with respect to FIGS. 1 and 2A). Because the source region 120 and the drain region 130 of each of transistors 100 are electrically isolated from substrate 110 by insulating layers 121 and 131, respectively, the transistors 100 are necessarily electrically isolated from one another (through substrate 110). In this manner, insulating layers 121 and 131 can eliminate the need for dedicated isolation structures (e.g., trench isolation structures).

Figure 3A:
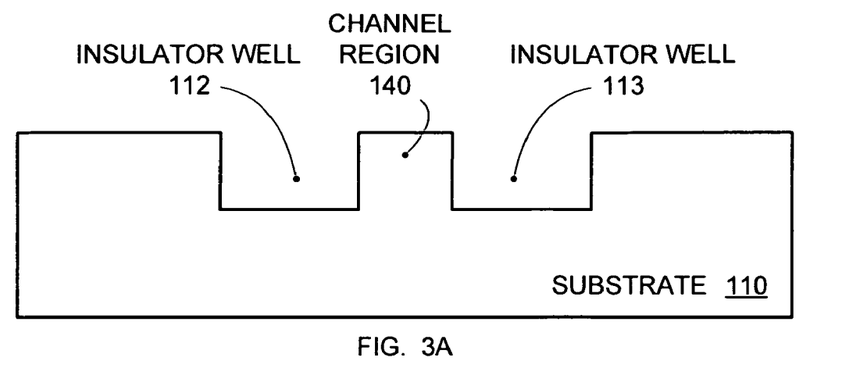
FIGS. 3A, 3B, 3C, 3D, and 3E show a manufacturing process for creating the FET transistor of FIGS. 1 and 2.
Figure 3B:
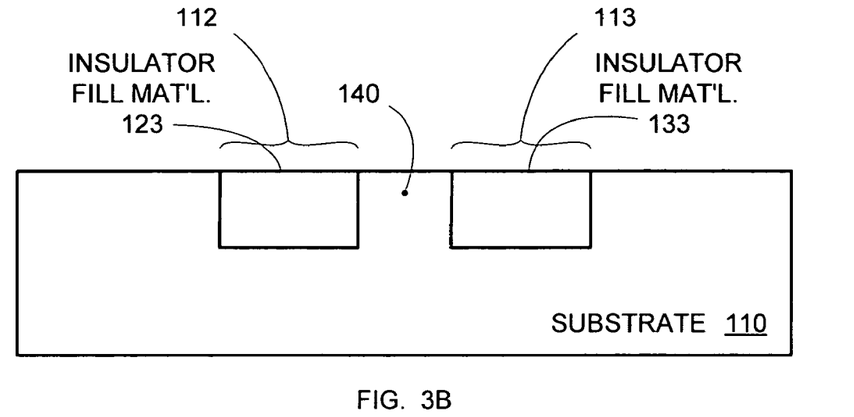
Figure 3C:
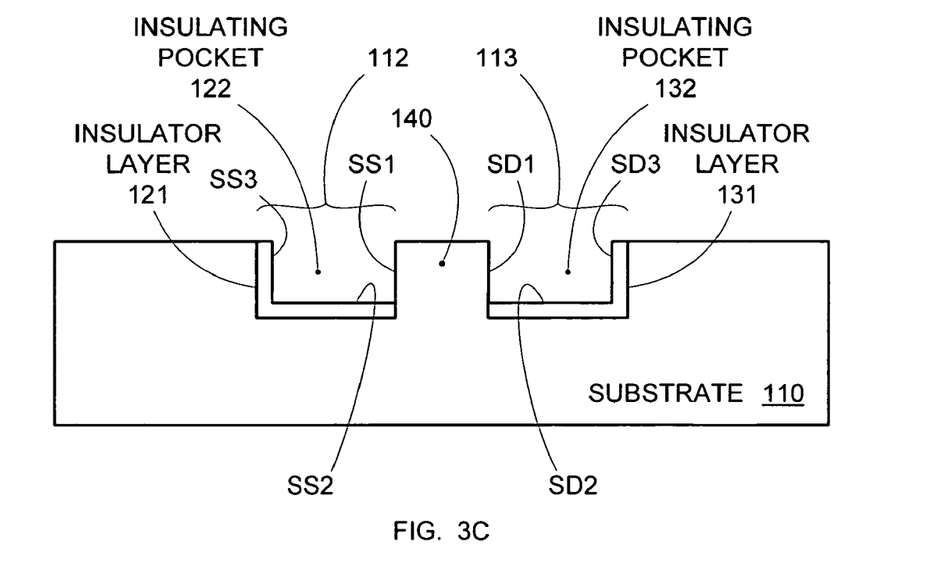

FIGS. 3A-3E depict an exemplary process for forming transistor 100 (shown in FIGS. 1 and 2). In FIG. 3A, insulator wells 112 and 113 are formed (e.g., etched) in a substrate 110. Insulator wells 112 and 113 are formed on either side of a channel region 140 for the final device. In FIG. 3B, insulator wells 112 and 113 are filled with insulator fill material 123 and 133. The fill operation can be performed, for example, using an oxide deposition tool. Then, in FIG. 3C, an insulated source pocket 122 and an insulated drain pocket 132 are formed (e.g., etched) in insulator fill 123 and insulator fill 133, respectively. Insulated source pocket 122 is sized and positioned such that a portion of insulator fill material 123 is left as an insulator layer 121 that coats all the non-channel surfaces of insulator well 112 (i.e., all surfaces of insulator well 112 except for the channel surface S1 adjacent to channel region 140). Similarly, insulated drain pocket 132 is sized and positioned such that a portion of insulator fill material 133 is left as an insulator layer 131 that coats all the non-channel surfaces of insulator well 113 (i.e., all surfaces of insulator well 113 except for channel surface S2).

Figure 3D:
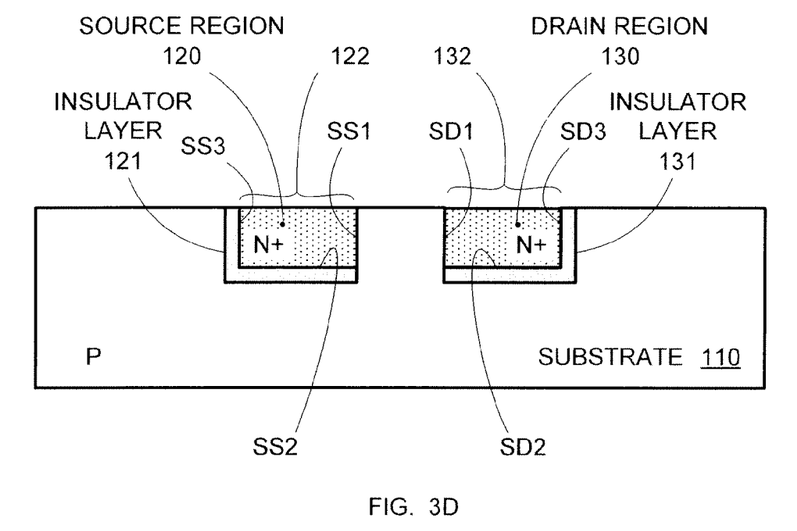
Figure 3E:
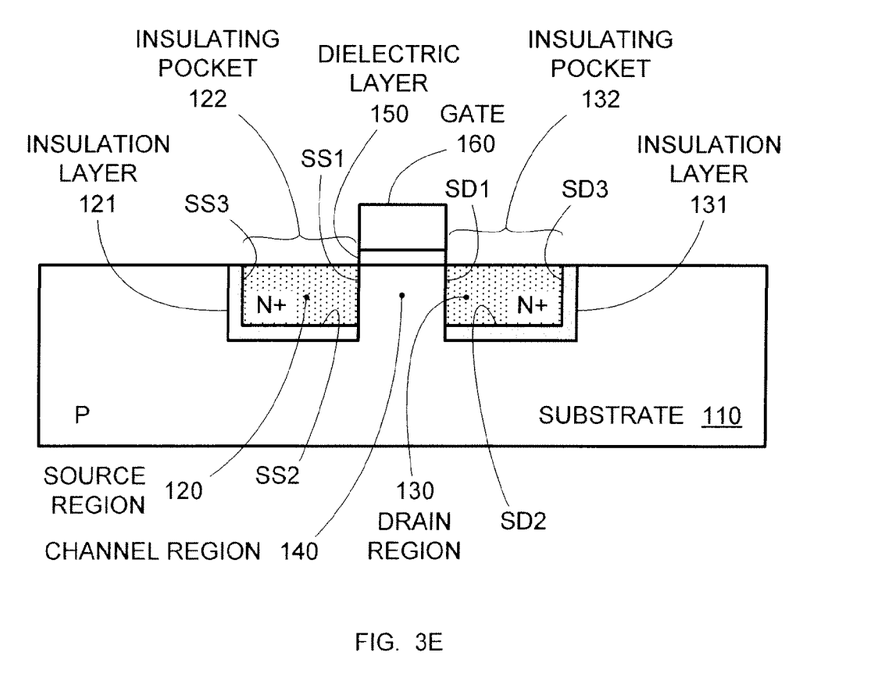

Next, in FIG. 3D, a source region 140 and a drain region 150 are formed in insulated source pocket 122 and insulated drain pocket 132, respectively. Source region 140 and drain region 150 can, for example, be formed using a diffusion fillup process, thereby allowing source region 140 and drain region 150 to be formed with a desired dopant concentration. Finally, a dielectric layer 150 and gate 160 can be formed over channel region 140 as shown in FIG. 3E to complete transistor 100. Note that incorporating insulated source pocket 122 and insulated drain pocket 132 into transistor 100 only requires a single additional mask (to perform the etch operation described with respect to FIG. 3C) over what would be required for conventional transistor production.

Figure 4A:
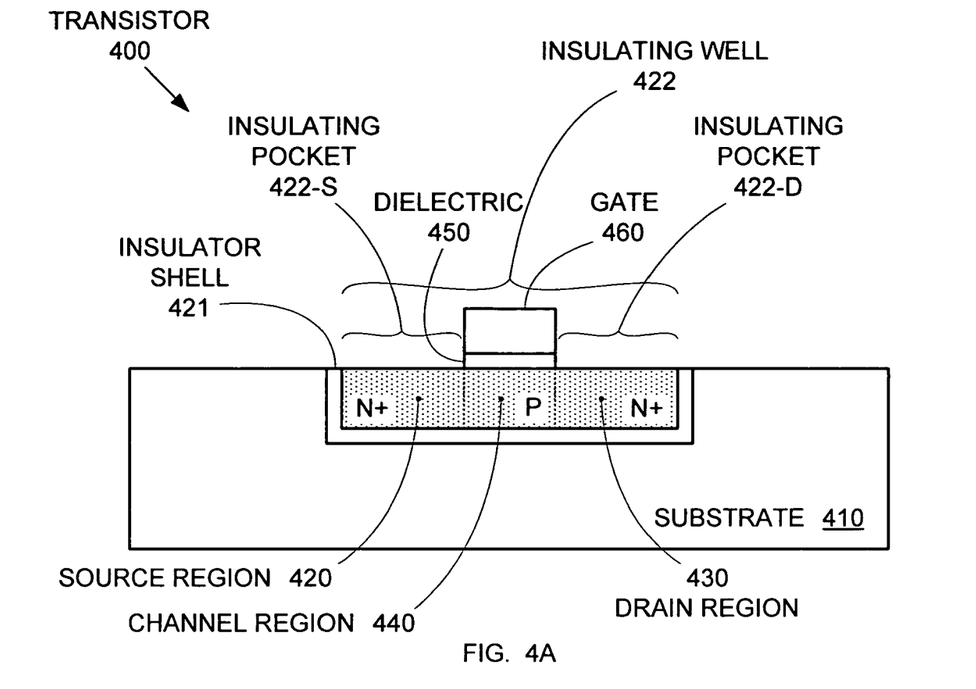
FIGS. 4A and 4B show a side and top view, respectively, of another FET transistor that includes source/drain insulating pockets for reducing leakage current.
Figure 4B:
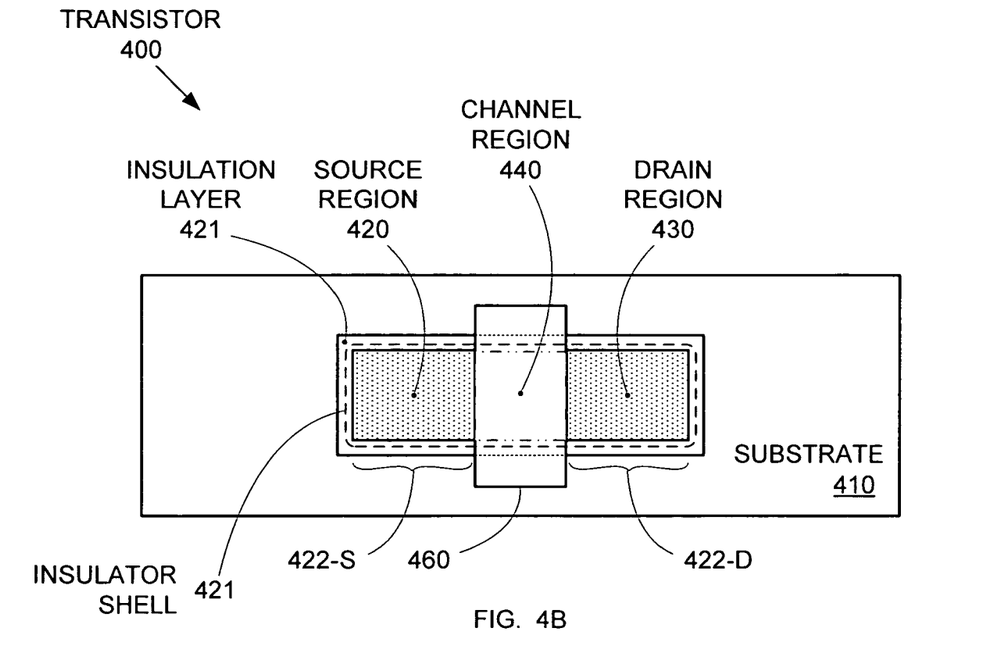

FIG. 4A shows another embodiment of a transistor 400 that includes structures for reducing leakage current. Transistor 400 includes a source region 420, a drain region 430, a gate dielectric 450 formed over a channel region 440 between source region 420 and drain region 430, and a gate 460 formed over gate dielectric 450. Similar to transistor 100 in FIG. 1, source region 420 and drain region 430 of transistor 400 are isolated from substrate 410 by insulating pockets 422-S and 422-D, respectively. However, unlike in transistor 100, insulating pockets 422-S and 422-D are not discrete structures, but rather are part of a single insulator shell 421. Insulator shell 421 is an insulating structure that defines an insulating well 422 in which source region 420, drain region 430, and channel region 440 of transistor 400 are formed. Insulator shell 421 can comprise any electrically-insulating material, such as those listed above with respect to insulation layers 121 and 131 in FIG. 1. FIG. 4B shows a top view of transistor 400 that depicts how insulator shell 421 encloses source region 420, drain region 430, and channel region 440, such that insulating pockets 422-S and 422-D surround the non-channel surfaces of source region 420 and drain region 430, respectively.

Insulating pockets 422-S and 422-D of transistor 400 therefore perform the same function as insulating pockets 122 and 132, respectively, of transistor 100 in FIG. 1. Specifically, insulating pockets 422-S and 422-D minimize the leakage power consumption and improve the switching speed of transistor 400 by significantly reducing the junction capacitances at source region 420 and drain region 430, respectively. Transistor 400 can be manufactured using steps substantially similar to those described with respect to FIGS. 3A-3E, except that the separate insulator wells 112 and 113 (shown in FIG. 3A) could be replaced with a single well in which insulator shell 421 could be formed (e.g., using sequential fill and etch operations, similar to those described with respect to FIGS. 3B and 3C). The resulting insulating well 422 could then be filled with source region 420, channel region 440, and drain region 430 (for example, using a diffusion fillup operation followed by appropriate implant operations to achieve the proper dopant concentrations in source region 420, channel region 440, and drain region 430).

Figure 5A:
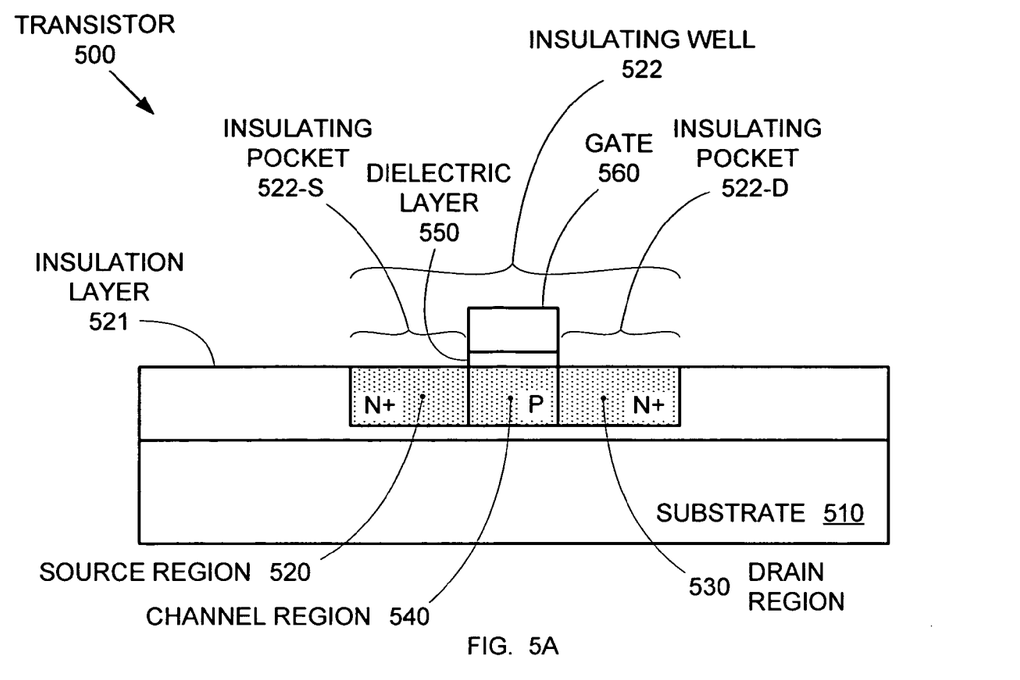
FIGS. 5A and 5B show a side and top view, respectively, of another FET transistor that includes source/drain insulating pockets for reducing leakage current.
Figure 5B:
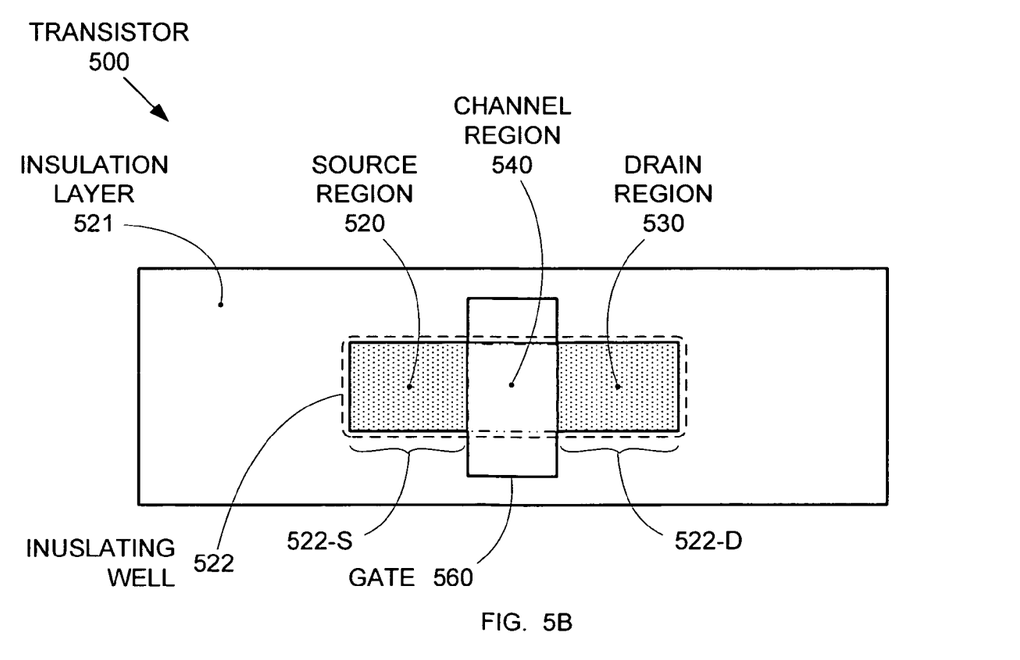

FIG. 5A shows another embodiment of a transistor 500 that includes structures for reducing leakage current. Transistor 500 includes a source region 520, a drain region 530, a gate dielectric 550 formed over a channel region 540 between source region 520 and drain region 530, and a gate 560 formed over gate dielectric 550. Similar to transistor 400 in FIGS. 4A and 4B, source region 520 and drain region 530 of transistor 500 are isolated from substrate 510 by insulating pockets 522-S and 522-D, respectively, that are part of a single insulating well 522. However, insulating pockets 522-S and 522-D are not defined by a structure formed in substrate 510 (such as insulating shell 421 in transistor 400). Instead, insulating well 522 is formed within a blanket insulation layer 521 that covers the entire surface (or a large portion) of substrate 510. Blanket insulation layer 521 can comprise any electrically-insulating material, such as those listed above with respect to insulation layers 121 and 131 in FIG. 1. Furthermore, blanket insulation layer 521 can be formed using any technique for creating such a layer, including ion implant-based techniques, such as separation by implanted oxygen (SIMOX) and separation by implanted oxygen and nitrogen (SIMON) (note that for silicon on insulator (SOI) substrates such as those formed using SIMOX/SIMON processes, insulating well 522 would typically be formed by etching through the top silicon layer into the underlying insulation layer). FIG. 5B shows a top view of transistor 500 that depicts how insulation layer source region 520, drain region 530, and channel region 540, are all formed within insulation layer 521 (in insulating well 522), such that insulating pockets 522-S and 522-D surround the non-channel surfaces of source region 520 and drain region 530, respectively.

Insulating pockets 522-S and 522-D of transistor 500 therefore perform the same function as insulating pockets 422-S and 522-D, respectively, of transistor 400 in FIGS. 4A and 4B. Specifically, insulating pockets 522-S and 522-D minimize the leakage power consumption and improve the switching speed of transistor 500 by significantly reducing the junction capacitances at source region 520 and drain region 530, respectively. Transistor 500 can be manufactured in a manner substantially similar to that described for transistor 400, except that rather than forming discrete insulator shells (e.g., insulator shell 421 in FIG. 4A) in a substrate (e.g., substrate 410 in FIG. 4A), a blanket insulation layer 521 could be formed over the entire substrate 510, and insulating wells 522 could be created at each desired transistor location. Each insulating well 522 could then be filled with source region 420, channel region 440, and drain region 430 (for example, using a silicon deposition operation followed by appropriate implant operations to achieve the proper dopant concentrations in source region 420, channel region 440, and drain region 430).

The various embodiments of the structures and methods of this invention that are described above are illustrative only of the principles of this invention and are not intended to limit the scope of the invention to the particular embodiments described. For example, any or all of transistors 100 in IC 200 shown in FIG. 2B could be replaced with transistors 400 and/or 500 shown in FIGS. 4B and 5B, respectively. Thus, the invention is limited only by the following claims and their equivalents.

The invention claimed is:

1. A field effect transistor (FET) formed in a substrate, the FET comprising:
   a channel region;
   a first insulating layer;
   a second insulating layer;
   a source region having a first sidewall in direct contact with the channel region, the source region being electrically isolated from the substrate by the first insulating layer, the first insulating layer surrounding the source region except along the first sidewall, wherein the first sidewall extends to a depth defined by a bottom of the source region, wherein the first insulating layer is a single layer;
   a drain region having a second sidewall in direct contact with the channel region, the drain region being electrically isolated from the substrate by the second insulating layer, the second insulating layer surrounding the drain region except along the second sidewall, wherein the second sidewall extends to a depth defined by a bottom of the drain region, wherein the second insulating layer is a single layer;
   a dielectric layer overlying the channel region; and
   a gate overlying the dielectric layer,
   wherein edges of the gate and the dielectric layer are aligned in a straight line with channel-side edges of the first and second insulating layers as well as the first and second sidewalls.

2. The FET of claim 1, wherein the first insulating layer and the second insulating layer are discrete structures.

3. The FET of claim 2, wherein the first insulating layer is formed within a first well in the substrate, and
   wherein the second insulating layer is formed within a second well in the substrate.

4. A method for manufacturing a field effect transistor (FET), the method comprising:
   forming a source region in a first insulating pocket, the first insulating pocket surrounding the source region except along a first sidewall, which is in direct contact with a channel region, the first insulating pocket electrically isolating the source region from a semiconductor substrate, wherein the first sidewall extends to a depth defined by a bottom of the source region, wherein the first insulating pocket is a single layer;
   forming a drain region in a second insulating pocket, the second insulating pocket surrounding the drain region except along a second sidewall, which is in direct contact with the channel region, the second insulating pocket electrically isolating the drain region from the semiconductor substrate, wherein the second sidewall extends to a depth defined by a bottom of the drain region, wherein the second insulating pocket is a single layer;
   forming a dielectric layer over the channel region; and
   forming a gate over the dielectric layer,
   wherein edges of the gate and the dielectric layer are aligned in a straight line with channel-side edges of the first and second insulating pockets as well as the first and second sidewalls, and wherein the first and second insulating pockets are formed from a single composition material.

5. The method of claim 4, further comprising:
   forming a first well and a second well in the semiconductor substrate;
   forming a first insulating layer in the first well to form the first insulating pocket;
   and forming a second insulating layer in the second well to form the second insulating pocket.

6. The method of claim 5, wherein forming the first insulating layer comprises filling the first well with an insulating material and etching the insulating material in the first well until the first insulating layer remains as a first coating over all non-channel surfaces of the first well, and
wherein forming the second insulating layer comprises filling the second well with the insulating material and etching the insulating material in the second well until the second insulating layer remains as a second coating over all non-channel surfaces of the second well.

7. The method of claim 6, wherein forming the source region comprises performing a diffusion fillup operation in the first insulating pocket, and
wherein forming the drain region comprises performing the diffusion fillup operation in the second insulating pocket.

8. An integrated circuit (IC) comprising a plurality of transistors, the plurality of transistors comprising a first transistor, the first transistor comprising:
a first channel region;
a first source region in a first insulating pocket, the first insulating pocket electrically isolating the first source region from a semiconductor substrate, the first insulating pocket surrounding the first source region except along a first sidewall, which is in direct contact with the first channel region, wherein the first sidewall extends to a depth defined by a bottom of the first source region, wherein the first insulating pocket is a single layer; and
a first drain region in a second insulating pocket, the second insulating pocket electrically isolating the first drain region from the semiconductor substrate, the second insulating pocket surrounding the first drain region except along a second sidewall, which is in direct contact with the first channel region, wherein the second sidewall extends to a depth defined by a bottom of the first drain region, wherein the second insulating pocket is a single layer;
a first dielectric layer overlying the first channel region; and
a first gate overlying the first dielectric layer,
wherein edges of the first gate and the first dielectric layer are aligned in a straight line with channel-side edges of the first and second insulating pockets as well as the first and second sidewalls, and wherein the first and second insulating pockets are formed from a single composition material.

9. The IC of claim 8, wherein the first insulating pocket comprises a first insulating layer formed in a first well in the substrate, and
wherein the second insulating pocket comprises a second insulating layer formed in a second well in the substrate.

10. The IC of claim 8, wherein the plurality of transistors further comprises a second transistor, the second transistor comprising:
a second channel region;
a second source region in a third insulating pocket, the third insulating pocket electrically isolating the second source region from the semiconductor substrate, the third insulating pocket surrounding the second source region except along a third sidewall, which is in direct contact with the second channel region, wherein the third insulating pocket is a single layer; and
a second drain region in a fourth insulating pocket, the fourth insulating pocket electrically isolating the second drain region from the semiconductor substrate, the fourth insulating pocket surrounding the second drain region except along a fourth sidewall, which is in direct contact with the second channel region, wherein the fourth insulating pocket is a single layer;
a second dielectric layer overlying the second channel region; and
a second gate overlying the second dielectric layer.

11. A field effect transistor (FET) formed in a substrate, the FET comprising:
a channel region;
a source region having a first sidewall in direct contact with the channel region;
a drain region having a second sidewall in direct contact with the channel region;
a first insulating layer isolating the source region from the substrate, the first insulating layer surrounding the source region except along the first sidewall, wherein the first insulating layer is a single layer;
a second insulating layer isolating the drain region from the substrate, the second insulating layer surrounding the drain region except along the second sidewall, wherein the second insulating layer is a single layer;
a dielectric layer overlying the channel region; and
a gate overlying the dielectric layer,
wherein edges of the gate and the dielectric layer are aligned in a straight line with channel-side edges of the first and second insulating layers as well as the first and second sidewalls.

12. The FET of claim 11, wherein the first insulating layer and the second insulating layer are discrete structures.

13. The FET of claim 12, wherein the first insulating layer is formed within a first well in the substrate, and wherein the second insulating layer is formed within a second well in the substrate.

14. A method for manufacturing a field effect transistor (FET), the method comprising:
forming a source region in a first insulating pocket, the first insulating pocket surrounding the source region except along a first sidewall, which is in direct contact with a channel region, the first insulating pocket isolating the source region from a semiconductor substrate, wherein the first insulating pocket is a single layer;
forming a drain region in a second insulating pocket, the second insulating pocket surrounding the drain region except along a second sidewall, which is in direct contact with the channel region, the second insulating pocket isolating the drain region from the semiconductor substrate, wherein the second insulating pocket is a single layer;
forming a dielectric layer over the channel region; and
forming a gate over the dielectric layer,
wherein edges of the gate and the dielectric layer are aligned in a straight line with channel-side edges of the first and second insulating pockets as well as the first and second sidewalls.

15. The method of claim 14, further comprising:
forming a first well and a second well in the semiconductor substrate;
forming a first insulating layer in the first well, thereby forming the first insulating pocket; and
forming a second insulating layer in the second well, thereby forming the second insulating pocket.

16. The method of claim 15, wherein forming the first insulating layer comprises filling the first well with an insulating material and etching the insulating material in the first well until the first insulating layer remains as a first coating over all non-channel surfaces of the first well, and
wherein forming the second insulating layer comprises filling the second well with the insulating material and etching the insulating material in the second well until the second insulating layer remains as a second coating over all non-channel surfaces of the second well.

17. The method of claim 16, wherein forming the source region comprises performing a diffusion fillup operation in the first insulating pocket, and wherein forming the drain region comprises performing the diffusion fillup operation in the second insulating pocket.

18. An integrated circuit (IC) comprising a plurality of transistors, the plurality of transistors comprising a first transistor, the first transistor comprising:
    a channel region;
    a source region having a first sidewall in direct contact with the channel region;
    a drain region having a second sidewall in direct contact with the channel region;
    a first insulating layer isolating the source region from a substrate, the first insulating layer surrounding the source region except along the first sidewall, wherein the first insulating layer is a single layer;
    a second insulating layer isolating the drain region from the substrate, the second insulating layer surrounding the drain region except along the second sidewall, wherein the second insulating layer is a single layer;
    a dielectric layer overlying the channel region; and
    a gate overlying the dielectric layer,
    wherein edges of the gate and the dielectric layer are aligned in a straight line with channel-side edges of the first and second insulating layers.

19. The IC of claim 18, wherein the first insulating layer is formed in a first well in the substrate, and the second insulating layer is formed in a second well in the substrate.

* * * * *

UNITED STATES PATENT AND TRADEMARK OFFICE
CERTIFICATE OF CORRECTION

PATENT NO. : 8,018,003 B2
APPLICATION NO. : 11/139255
DATED : September 13, 2011
INVENTOR(S) : Chandrashekhar V. Patil It is certified that error appears in the above-identified patent and that said Letters Patent is hereby corrected as shown below:

In the Claims:

Column 7
Claim 9, Line 49, insert --semiconductor-- before "substrate".
Claim 9, Line 51, insert --semiconductor-- before "substrate".

Signed and Sealed this
Thirtieth Day of April, 2013

Teresa Stanek Rea
*Acting Director of the United States Patent and Trademark Office*